US009513567B2

(12) United States Patent
Hara et al.

(10) Patent No.: US 9,513,567 B2
(45) Date of Patent: Dec. 6, 2016

(54) EXPOSURE APPARATUS AND EXPOSURE METHOD

(71) Applicant: National Institute of Advanced Industrial Science and Technology, Chiyoda-ku, Tokyo (JP)

(72) Inventors: Shiro Hara, Ushiku (JP); Sommawan Khumpuang, Tsukuba (JP); Yoshiki Inuzuka, Shizuoka (JP); Yasuaki Yokoyama, Tokyo (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 158 days.

(21) Appl. No.: 14/363,489

(22) PCT Filed: Dec. 4, 2012

(86) PCT No.: PCT/JP2012/081413
§ 371 (c)(1),
(2) Date: Jun. 6, 2014

(87) PCT Pub. No.: WO2013/084898
PCT Pub. Date: Jun. 13, 2013

(65) Prior Publication Data
US 2014/0320840 A1    Oct. 30, 2014

(30) Foreign Application Priority Data
Dec. 6, 2011   (JP) ................................ 2011-267030

(51) Int. Cl.
G03B 27/58    (2006.01)
G03F 7/20    (2006.01)
H01L 21/677    (2006.01)

(52) U.S. Cl.
CPC ......... *G03F 7/70716* (2013.01); *G03F 7/2051* (2013.01); *G03F 7/70733* (2013.01);
(Continued)

(58) Field of Classification Search
CPC   G03F 7/2051; G03F 7/70716; G03F 7/70733; H01L 21/677; H01L 21/67796; H01L 21/67733; H01L 21/67736
See application file for complete search history.

(56) References Cited

U.S. PATENT DOCUMENTS 5,550,635  A    8/1996  Saitoh et al.
2002/0024647  A1    2/2002  Nakahara et al.
(Continued)

FOREIGN PATENT DOCUMENTS

JP    7-270123 A    10/1995
JP    2000-91401 A    3/2000
(Continued)

OTHER PUBLICATIONS

Corresponding International Search Report dated Mar. 12, 2013 with English Translation (three (3) pages).

*Primary Examiner* — Deoram Persaud
(74) *Attorney, Agent, or Firm* — Crowell & Moring LLP

(57) ABSTRACT

To provide a mask aligner that can appropriately manage very small-quantity production and multiproduct production. The present invention is a mask aligner 1 that exposes a wafer W in a predetermined size through a mask M, and has a configuration that includes: a conveying device 5 for conveying the wafer W and the mask M; an exposure stage 3*f* on which the wafer W conveyed by the conveying device 5 is installed; a mask holder 3*b* that is mounted to face the exposure stage 3*f* and on which the mask M conveyed by the
(Continued)

conveying device 5 is installed; and an LED light source 8c mounted to face the exposure stage 3f via the mask holder 3b.

11 Claims, 9 Drawing Sheets

(52) U.S. Cl.
CPC ...... *H01L 21/677* (2013.01); *H01L 21/67733* (2013.01); *H01L 21/67736* (2013.01); *H01L 21/67796* (2013.01)

(56) References Cited

U.S. PATENT DOCUMENTS

| | | | | |
|---|---|---|---|---|
| 2002/0089655 A1* | 7/2002 | Kida | ............ | G03F 7/70691 355/72 |
| 2004/0184036 A1* | 9/2004 | Kusumoto | ............ | G01B 11/272 356/401 |
| 2004/0234360 A1* | 11/2004 | Hayashi | ............ | H01L 21/67778 414/217 |
| 2005/0121144 A1* | 6/2005 | Edo | ............ | G03F 7/70741 156/345.32 |
| 2005/0200822 A1* | 9/2005 | Tak | ............ | G03B 27/50 355/67 |
| 2006/0291982 A1* | 12/2006 | Tanaka | ............ | G03F 7/70741 414/222.01 |
| 2007/0054064 A1* | 3/2007 | Ohmi | ............ | H01L 21/306 427/569 |
| 2007/0121092 A1* | 5/2007 | Mochizuki | ............ | G03F 7/70741 355/75 |
| 2010/0021577 A1* | 1/2010 | Stewart | ............ | B82Y 10/00 425/3 |
| 2012/0236283 A1* | 9/2012 | Mizumura | ............ | G03F 7/70275 355/67 |
| 2014/0306124 A1* | 10/2014 | Hara | ............ | H01L 21/6719 250/453.11 |

FOREIGN PATENT DOCUMENTS

| | | |
|---|---|---|
| JP | 2000-311850 A | 11/2000 |
| JP | 2001-237167 A | 8/2001 |

* cited by examiner

EXPOSURE APPARATUS AND EXPOSURE METHOD

TECHNICAL FIELD

The present invention relates to an exposure apparatus and an exposure method that expose a wafer through a mask.

BACKGROUND ART

In recent years, the manufacturing line for semiconductor devices in which this type of exposure apparatus is used includes a plurality of units called bays in which treatment apparatuses with the same type of functions are brought together within a vast clean room. A layout that employs a job-shop system has become mainstream. In the job-shop system, the bays are coupled together by a transfer robot and a belt conveyer.

As the workpiece treated in that manufacturing line, a wafer with a large diameter of, for example, 12 inches is used. In the production system, thousands of semiconductor chips are manufactured from one wafer.

However, with this job-shop system, in the case where a plurality of similar treatment processes are repeated, the conveyance distance within the bay or the conveyance distance between bays significantly increase in length, and the wait time increases. Thus, the manufacturing time increases. This causes a cost increase, for example, causes an increase in work in process. Therefore, the low productivity may become a problem as a manufacturing line for mass production of the workpieces.

Therefore, instead of the conventional manufacturing line in the job-shop system, a manufacturing line in a flow-shop system is also proposed. In this manufacturing line, semiconductor treatment apparatuses are arranged in the order corresponding to the treatment processes.

While this manufacturing line in the flow-shop system is optimal for manufacturing singular products in large quantities, it is necessary to rearrange the installation of the respective semiconductor treatment apparatuses in the manufacturing line in the order corresponding to the treatment flow of the workpiece in the case where the manufacturing procedure (recipe) needs to be changed due to a change of products. However, this rearrangement every time the products are changed is not realistic considering labor and time for the rearrangement. Especially, under the circumstances in which huge semiconductor treatment apparatuses are fixedly disposed within the closed space that is the clean room, it is realistically impossible to rearrange the semiconductor treatment apparatuses each time.

There is the need for manufacturing semiconductor in very small quantities, for example, several pieces to several hundreds of pieces in a manufacturing unit for engineer samples or ubiquitous sensors. However, in a huge manufacturing line in the b-shop system or the flow-shop system described above, manufacturing semiconductor in very small quantities extremely reduces the cost performance. Therefore, other kinds of products need to be manufactured in that manufacturing line.

However, when a wide variety of products are input at the same time for mixed production in that manner, the productivity of the manufacturing line further decreases with increasing number of types of products. As a result, in this huge manufacturing line, very small-quantity production and multiproduct production cannot be appropriately managed.

As the exposure apparatus used for this type of manufacturing line, Patent Literature 1 discloses a conventional technique that exposes a plurality of wafers without replacing the mask. In this Patent Literature 1, while replacing the patterns of a plurality of masks installed in a predetermined chamber, the configuration exposes one wafer (substrate) to be conveyed to the inside of this chamber by transferring several times.

CITATION LIST

Patent Literature

PATENT LITERATURE 1: Japanese Unexamined Patent Application Publication No. 2001-237167

SUMMARY OF INVENTION

Technical Problem

However, in the conventional technique disclosed in above-described Patent Literature 1, the wafer is exposed using the plurality of masks installed within the chamber. For use in semiconductor manufacture in very small quantities, for example, several pieces to several hundreds of pieces in a manufacturing unit, the plurality of masks installed within the chamber needs to be replaced every time the types of semiconductor products to be manufactured are changed by disassembling the exposure apparatus or similar method. Accordingly, the cost performance might be extremely reduced. Therefore, it is not easy to appropriately manage very small-quantity production and multiproduct production.

Generally, the mask and the wafer are different in shape. Accordingly, completely different two conveyance mechanisms are disposed inside of the exposure apparatus. Therefore, respective doorways for the mask and the wafer to the exposure apparatus are disposed. Furthermore, since these mask and wafer are different in shape, the shape of the container for housing the mask or wafer and the position of the doorway are also different for the mask and the wafer. Accordingly, the conveyance path between apparatuses and the mechanism for conveyance between apparatuses are also completely separated for the mask and the wafer. As a result, a microfabricated system that includes an exposure apparatus in a mask system includes respective separate conveyance systems for the mask and the wafer inside and outside of the apparatus. This results in a problem of complexity and high cost due to necessity of two similar mechanisms.

Furthermore, these mask and wafer are used for exposure as one set. Therefore, a specific mask needs to be combined with a specific wafer. Accordingly, the conveyance system of the mask and the conveyance system of the wafer need two accurate control systems for accurately combining the mask and the wafer passing through respective different conveyance paths. Originally, the current microfabricated system becomes enlarged due to the wafer conveyance system alone and further needs to ensure synchronization with the control of the mask. Thus, the complexity and the enlargement have become significant problems.

Especially, when the variety of products becomes wider and the quantity of products becomes smaller, the mask needs to be carefully and quickly changed. This causes an increase of bugs in the system, an increase in cost, and an enormous reduction in manufacturing speed.

The present invention has been made in view of the actual situation in the above-described conventional technique, and its object is to provide an exposure apparatus and an exposure method that appropriately manage very small-quantity production and multiproduct production.

Solution to Problem

In order to achieve the objects described above, the present invention is an exposure apparatus for exposing a wafer in a predetermined size through a mask. The exposure apparatus includes a conveying device, an exposure stage, a mask holder, and an exposure light source. The conveying device is configured to convey the wafer and the mask. On the exposure stage, the wafer conveyed by the conveying device is to be installed. The mask holder is mounted to face the exposure stage. The mask conveyed by the conveying device is to be installed on the mask holder. The exposure light source is mounted to face the exposure stage via the mask holder.

With the present invention thus configured, the mask is conveyed by the conveying device so as to be installed on the mask holder. Additionally, the wafer is conveyed by the conveying device to be installed on the exposure stage. In this state, irradiation of the light from the exposure light source allows exposing the wafer through the mask. That is, the configuration conveys the mask for exposing the wafer to the mask holder using the conveying device that conveys the wafer to the exposure stage. Accordingly, these wafer and mask can be changed every exposure. This can facilitate replacing or selecting the mask corresponding to the wafer to be exposed. This allows appropriately managing very small-quantity production and multiproduct production.

Additionally, in order to achieve the objects described above, the present invention is the exposure apparatus that includes a front chamber. The front chamber includes an installation port for installing the wafer and the mask to be conveyed by the conveying device. The conveying device is configured to convey the wafer and the mask installed on the installation port of the front chamber to between the exposure stage and the mask holder.

With the present invention thus configured, the wafer installed on the installation port of the front chamber is conveyed to between the exposure stage and the mask holder by the conveying device so as to be installed on the exposure stage. The mask installed on the installation port of the front chamber is conveyed to between the exposure stage and the mask holder by the conveying device to be installed on the mask holder. This ensures a short conveyance path of the conveying device during conveyance of these wafer and mask, thus allowing more appropriate exposure treatment in a shorter period.

Additionally, in order to achieve the objects described above, the present invention is a semiconductor manufacturing system that includes the exposure apparatus. The mask and the wafer have the same size. Conveyance of the mask and conveyance of the wafer are performed by one conveyance system between apparatuses.

With the present invention thus configured, the mask and the wafer have the same size. The conveyance of the mask and the conveyance of the wafer are performed by one conveyance system between apparatuses. This ensures a simple system and a faster response, and reduces the occurrence of bugs.

Additionally, in order to achieve the objects described above, the present invention is an exposure method that includes a mask carry-in step, a wafer carry-in step, an exposure process, a wafer carry-out process, and a mask carry-out process. The mask carry-in step conveys a mask by the conveying device of the exposure apparatus and installs the mask on a side facing the exposure stage in the mask holder. The wafer carry-in step conveys a wafer by the conveying device and installs the wafer on a side facing the mask holder in the exposure stage. The exposure process causes irradiation of a light from the exposure light source to expose the wafer through the mask. The wafer carry-out process conveys the wafer by the conveying device to carry out the wafer from the exposure stage. The mask carry-out process conveys the mask by the conveying device to carry out the mask from the mask holder.

With the present invention thus configured, the mask is conveyed by the conveying device to install the mask on the side facing the exposure stage in the mask holder. Subsequently, the wafer is conveyed by the conveying device to install the wafer on the side facing the mask holder in the exposure stage. In this state, the light is irradiated from the exposure light source so as to expose the wafer through the mask. Subsequently, the wafer is conveyed by the conveying device and carried out from the exposure stage. Subsequently, the mask is conveyed by the conveying device and carried out from the mask holder in the configuration. As a result, the conveying device that conveys the wafer to the exposure stage can be used to convey the mask for exposing the wafer to the mask holder. Accordingly, this can facilitate replacing or selecting the mask corresponding to the wafer to be exposed, thus facilitating the conveyance and the installation of these wafer and mask. This allows appropriately managing very small-quantity production and multiproduct production.

Additionally, in order to achieve the objects described above, the present invention is the exposure method. The mask carry-in step includes conveying the mask installed on the installation port of the front chamber by the conveying device. The wafer carry-in step includes conveying the wafer installed on the installation port of the front chamber by the conveying device. The wafer carry-out process includes conveying the wafer from the exposure stage to the installation port of the front chamber. The mask carry-out process includes conveying the mask from the mask holder to the installation port of the front chamber.

With the present invention thus configured, in the mask carry-in step and the wafer carry-in step, the mask and the wafer installed on the installation port of the front chamber are conveyed by the conveying device. In the wafer carry-out process, the wafer is conveyed from the exposure stage to the installation port of the front chamber. In the mask carry-out process, the mask is conveyed from the mask holder to the installation port of the front chamber. This ensures approximately the same conveyance path of the conveying device during conveyance of these wafer and mask and a shorter conveyance path for these wafer and mask, thus allowing more appropriate exposure treatment in a shorter period.

Additionally, in order to achieve the objects described above, the present invention is the exposure method. The exposure process includes exposing the wafer through the mask in a state where the wafer is laminated on the mask.

With the present invention thus configured, in a state where the wafer is laminated on the mask, the wafer is exposed through the mask. This can ensure approximately the same size of the mask as the size of the wafer and downsize the mask, thus allowing more appropriately managing very small-quantity production and multiproduct production.

Advantageous Effects of Invention

With the present invention, the mask is conveyed by the conveying device so as to be installed on the mask holder.

Additionally, the wafer is conveyed by the conveying device to be installed on the exposure stage. Subsequently, irradiation of the light from the exposure light source allows exposing the wafer through the mask. That is, the configuration conveys the mask for exposing the wafer to the mask holder using the conveying device that conveys the wafer. Accordingly, these wafer and mask can be changed every exposure. This can facilitate replacing or selecting the mask corresponding to the wafer to be exposed. This allows appropriately managing very small-quantity production and multiproduct production.

BRIEF DESCRIPTION OF DRAWINGS

FIG. 8 includes schematic explanatory views each illustrating a part of the above-described exposure apparatus.

DESCRIPTION OF EMBODIMENTS

The following describes an exemplary embodiment of the present invention by referring to the accompanying drawings.

Figure 1:
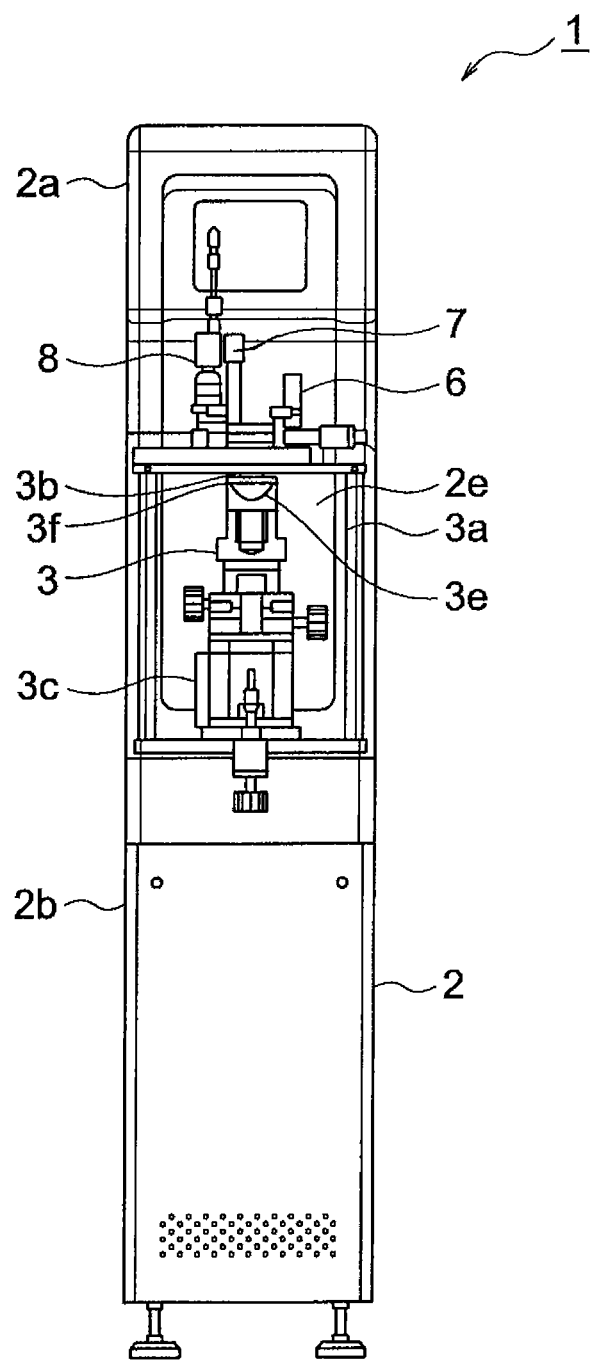
FIG. 1 is a front view illustrating an exposure apparatus according to one embodiment of the present invention.
Figure 2:
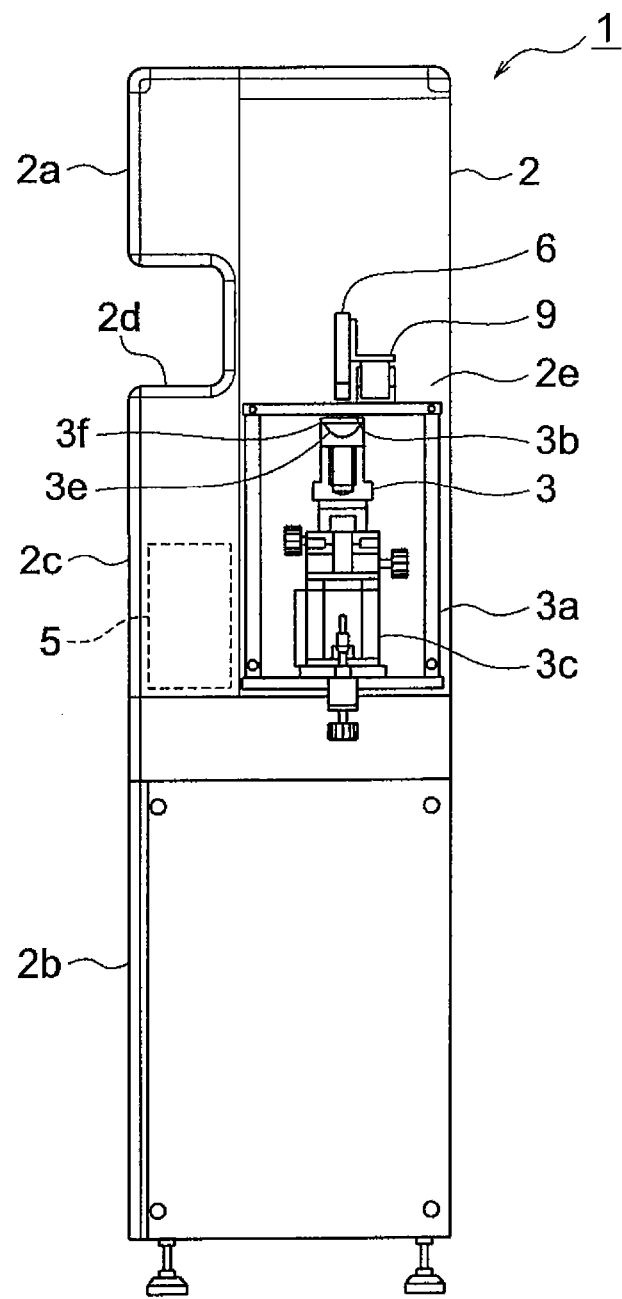
FIG. 2 is a right side view illustrating the above-described exposure apparatus.
Figure 3:
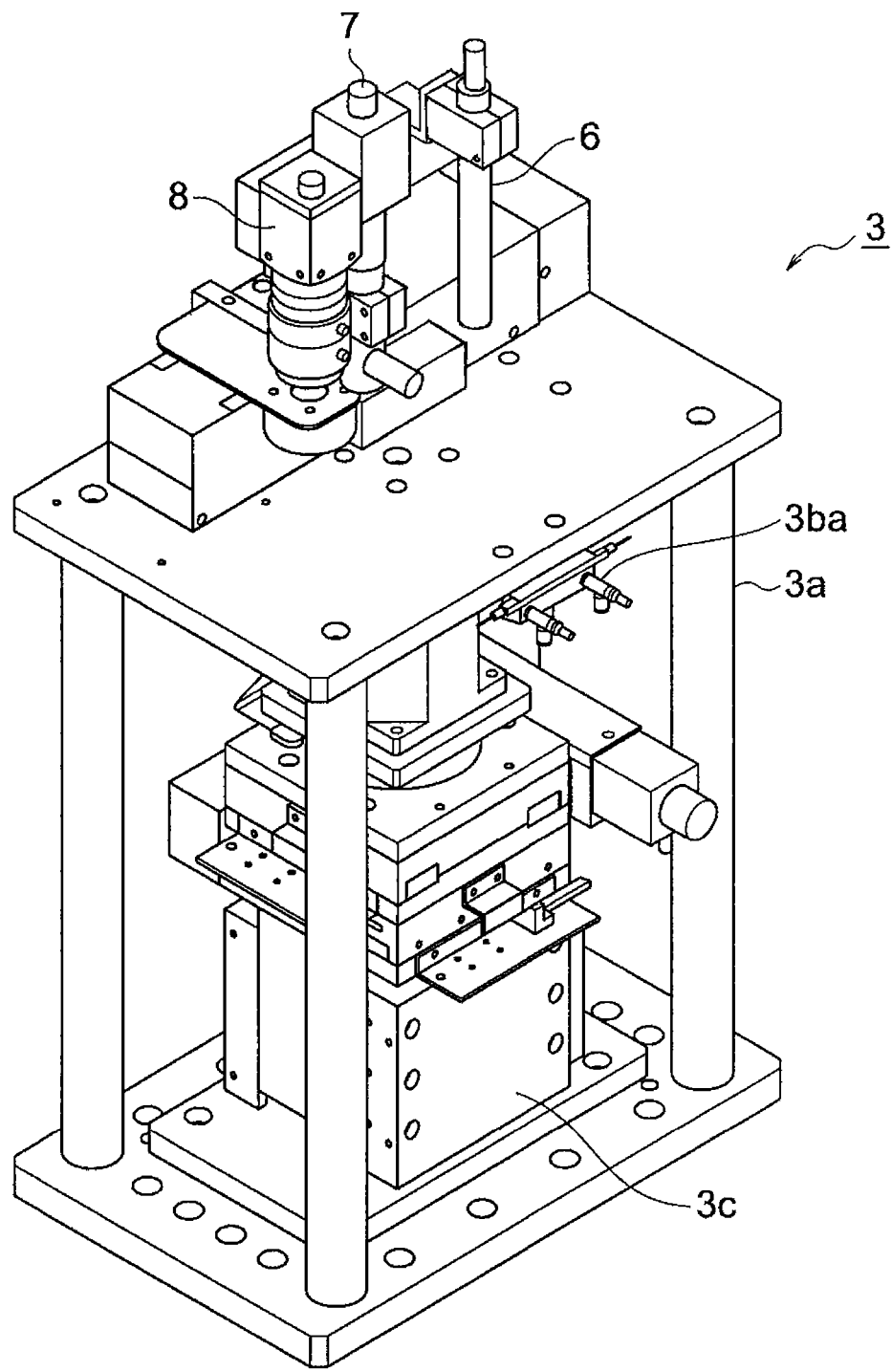
FIG. 3 is a left-front side perspective view illustrating an exposure unit of the above-described exposure apparatus.
Figure 4:
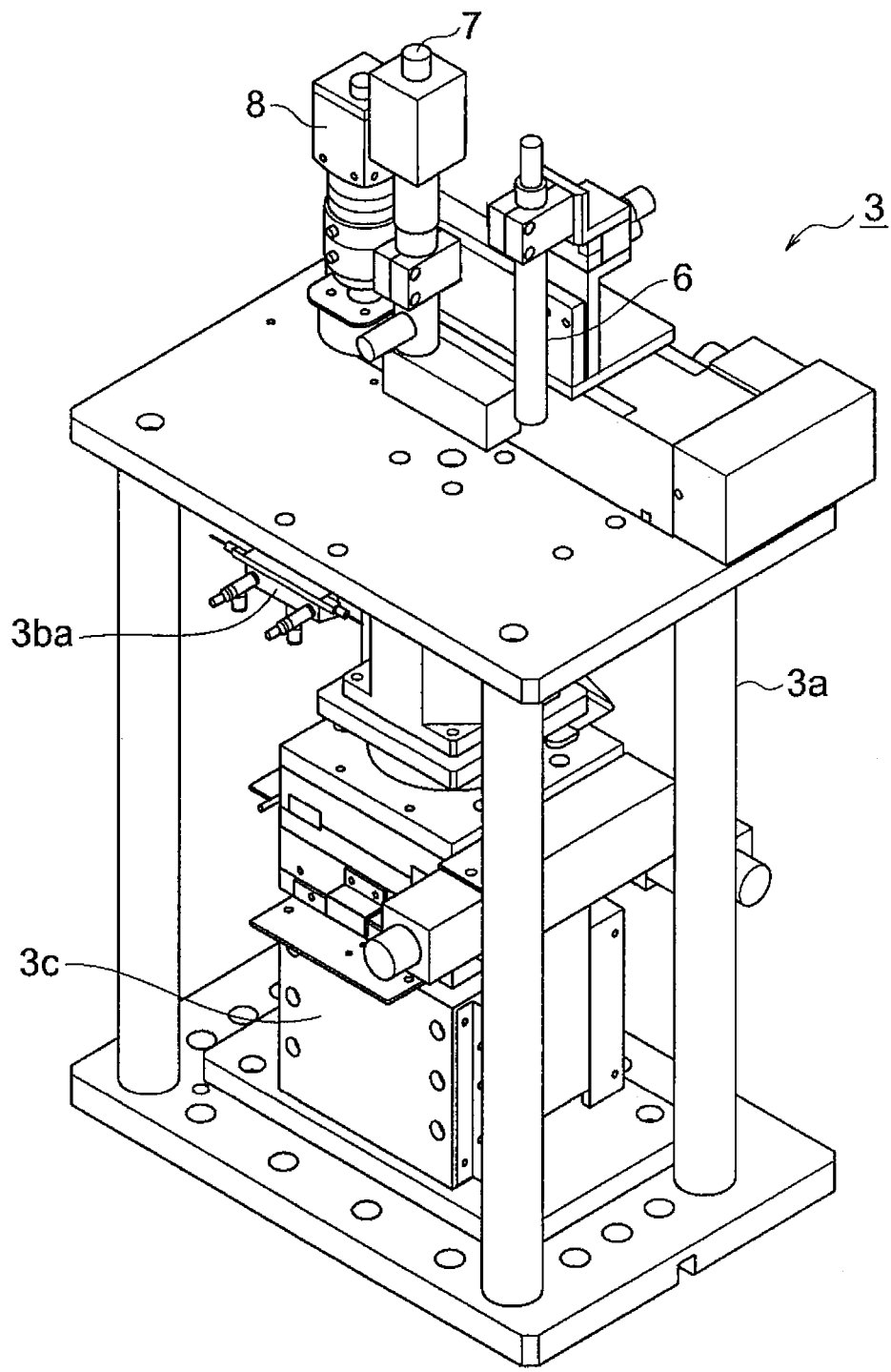
FIG. 4 is a right-back side perspective view illustrating the above-described exposure unit.
Figure 5:
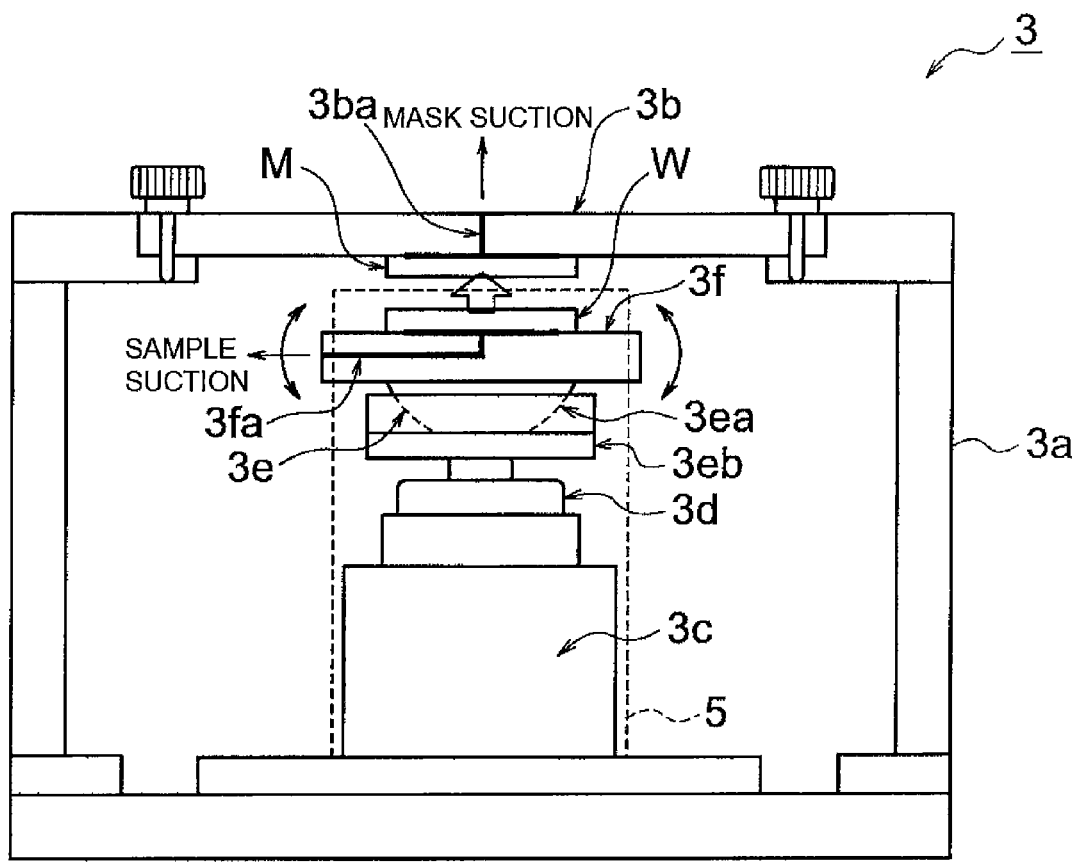
FIG. 5 is a schematic explanatory view illustrating the above-described exposure unit.
Figure 6:
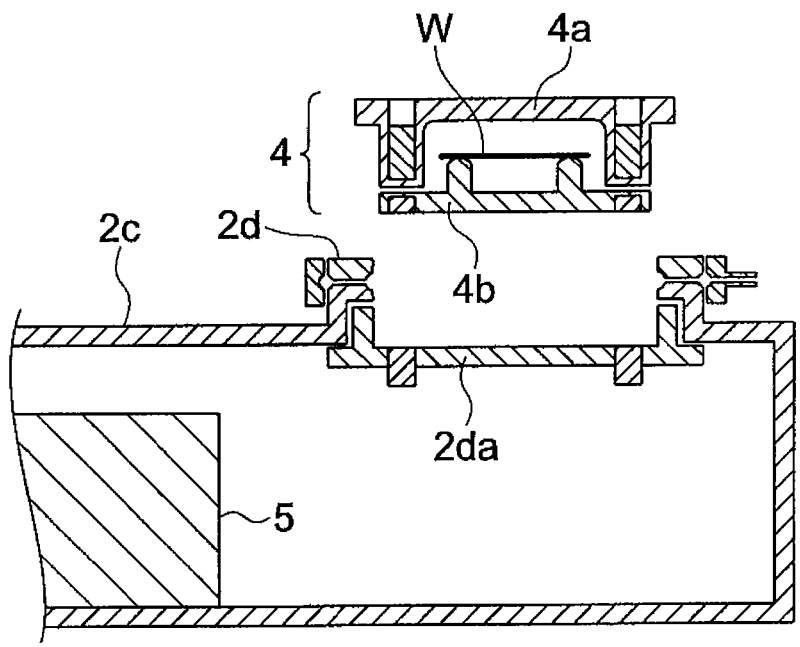
FIG. 6 is a schematic cross-sectional view illustrating a state where a conveyance container is installed on a front chamber of the above-described exposure apparatus.
Figure 7:
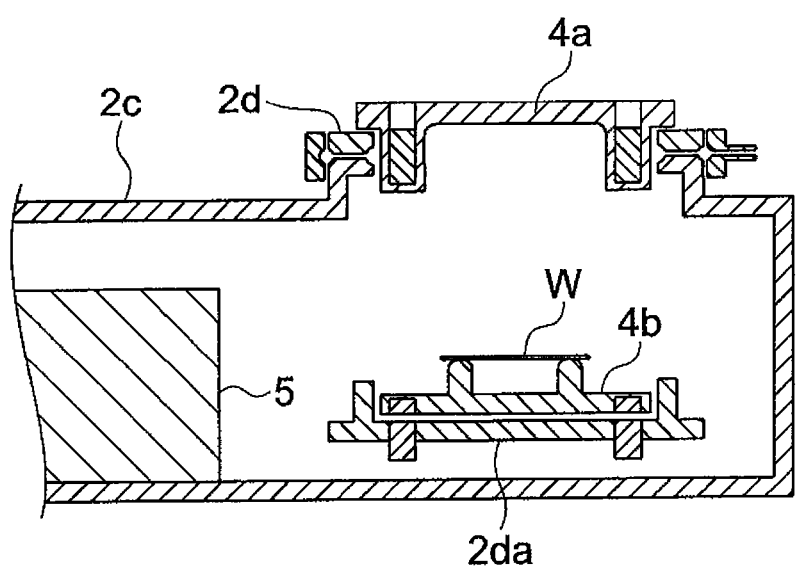
FIG. 7 is a schematic cross-sectional view illustrating a state where the conveyance container installed on the front chamber of the above-described exposure apparatus is opened.
Figures 8A, 8B:
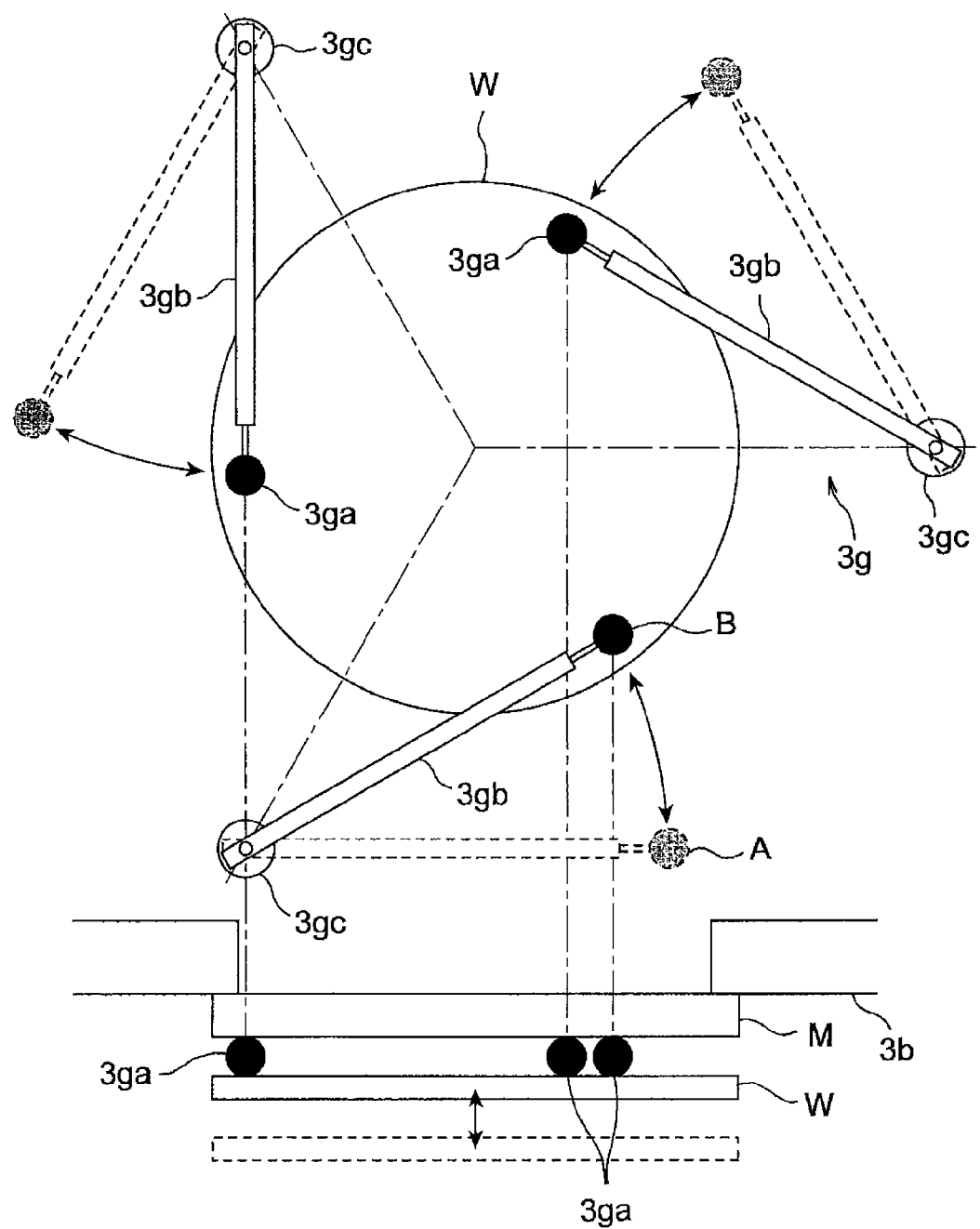
FIG. 8(A) is a plan view.
FIG. 8(B) is a side view.
Figure 9:
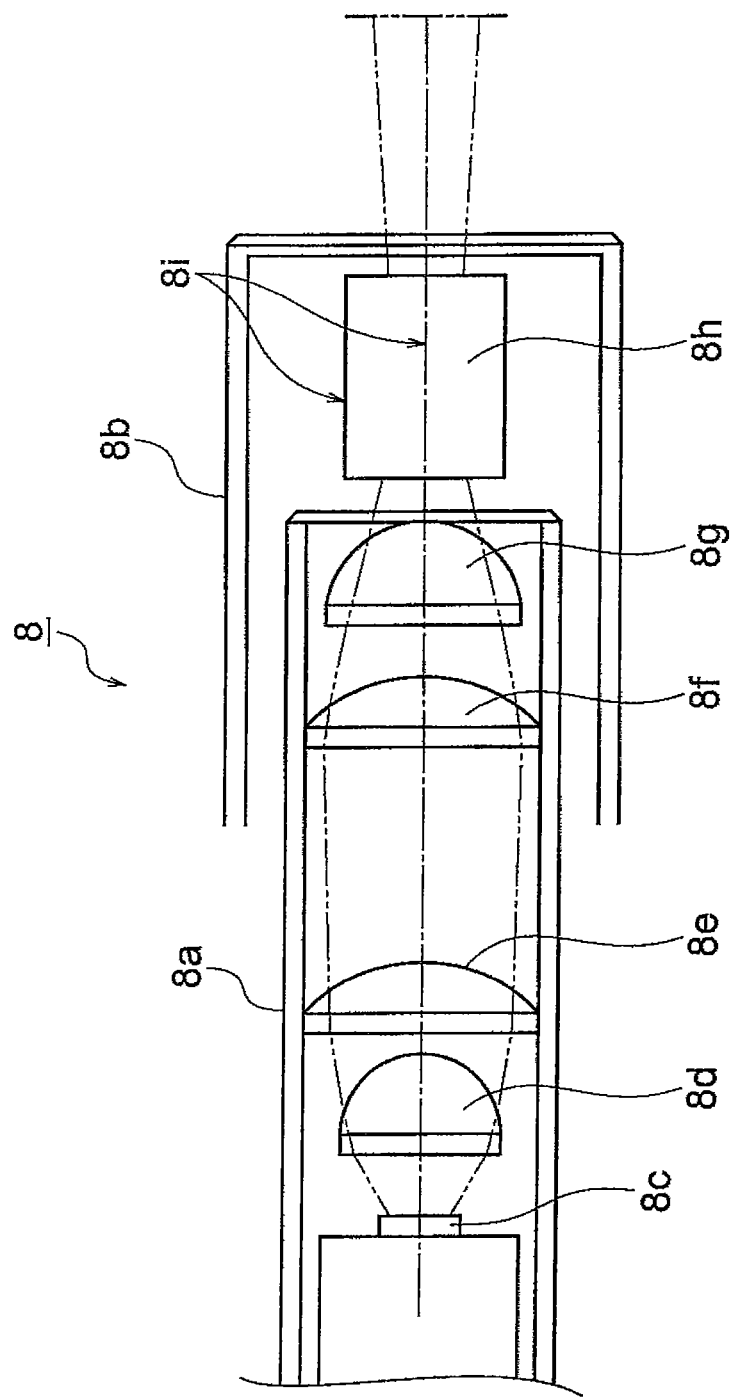
FIG. 9 is a schematic explanatory view illustrating a part of an exposure light source of the above-described exposure apparatus.

FIG. 1 is a front view illustrating an exposure apparatus according to one embodiment of the present invention. FIG. 2 is a right side view illustrating the exposure apparatus. FIG. 3 is a left-front side perspective view illustrating an exposure unit of the exposure apparatus. FIG. 4 is a right-back side perspective view illustrating the exposure unit. Additionally, FIG. 5 is a schematic explanatory view illustrating the exposure unit. FIG. 6 is a schematic cross-sectional view illustrating a state where a conveyance container is installed in a front chamber of the exposure apparatus. FIG. 7 is a schematic cross-sectional view illustrating a state where the conveyance container installed in the front chamber of the exposure apparatus is opened. Additionally, FIG. 8 is a schematic explanatory view illustrating a part of the exposure apparatus. FIG. 8(A) is a plan view. FIG. 8(B) is a side view. FIG. 9 is a schematic cross-sectional explanatory view illustrating a part of an exposure light source of the exposure apparatus.

As one embodiment of the exposure apparatus according to the present invention, the mask aligner 1 is a minimal aligner housed in a chassis 2 with a preliminarily specified size based on a minimal fab concept as illustrated in FIG. 1 and FIG. 2. Here, this minimal fab concept is appropriate for a wide variety of products in small quantities in the semiconductor manufacturing market and can be applied to various fabs for saving resources, energy, and investment and for ensuring high performance. The minimal fab concept is for realizing a minimal manufacturing system that minimalizes the production described in, for example, Japanese patent application No. 2010-195996.

The chassis 2 of the mask aligner 1 is formed in an approximately rectangular parallelepiped shape with a longitudinal direction along the vertical direction. The chassis 2 has a structure that blocks both of fine particles and gas molecules flowing to the inside, and has a yellow room structure that blocks the entrance of the UV light. In an apparatus upper portion 2a on the upper side of this chassis 2, an exposure unit 3 is housed. On the lower side of this chassis 2, an apparatus lower portion 2b is disposed. The apparatus lower portion 2b incorporates a raw-material supplying system for the apparatus upper portion 2a, an exhaust system, a control unit, and similar portion.

Furthermore, in the middle portion of this apparatus upper portion 2a of the chassis 2 along the vertical direction, a depressed shape portion is formed. The depressed shape portion has a depressed shape on the front side of this chassis 2 from the side view. The lower-side portion of this depressed shape portion is a front chamber 2c for carrying a wafer W and a mask M in the chassis 2. Approximately in the center of the top surface of this front chamber 2c, a docking port 2d in an approximately circular shape is disposed as a shuttle housing portion for installing a conveyance container 4. Here, this front chamber 2c is disposed for blocking both of fine particles and gas molecules flowing into the chassis 2. That is, this front chamber 2c is a particle lock air-tight docking (PLAD) system for taking the wafer W or the mask M housed in the conveyance container 4 in and out of the inside of the chassis 2 without, for example, exposure to the external air. Furthermore, within this front chamber 2c, a conveying device 5 is housed. The conveying device 5 conveys the wafer W and the mask M to be carried in from the docking port 2d to respective predetermined positions in the exposure unit 3, and carries out the wafer W and the mask M after being exposed by this exposure unit 3 to the docking port 2d.

Furthermore, the exposure unit 3 is housed and mounted in a wafer process chamber 2e in the back-side upper portion of the front chamber 2c within the chassis 2. The wafer W to be exposed by this exposure unit 3 is formed in a disk shape with a surface as one side surface that has a circular shape with a predetermined size, for example, a diameter of 12.5 mm. In this wafer W, a photoresist is formed and an alignment mark for positioning with respect to the mask M is disposed. Here, the portion approximately at 1 mm from the outer periphery of this wafer W is dead space that is not a pattern area, specifically, used as a holding space for vacuum suction. The mask M is an exposure mask in which an exposure pattern for exposing the wafer W is preliminarily formed, and employs a mask formed in a disk shape with the same size as the size of the wafer W. Also, on this mask M, an alignment mark for positioning with respect to the wafer W is disposed.

Next, the conveying device 5 employs, for example, the workpiece conveying device disclosed in Japanese Unexamined Patent Application Publication No. 2011-96942 or similar device. This workpiece conveying device employs a slide-type expansion/contraction actuator that sequentially extends and retracts a plurality of long thin rod-shaped machine bodies to convey a wafer or a mask held by a supporting member disposed at the distal end of these machine bodies.

Furthermore, as illustrated in FIG. 5, the exposure unit 3 includes a framing body 3a in a rectangular frame shape in front view. The central portion of a flat plate-shaped plate material positioned on the upper side of this framing body 3a is opened to form an opening portion. On the inner side of this opening portion, a flat plate-shaped mask holder 3b is mounted. This mask holder 3b is mounted to face the top surface of the exposure stage 3f on a side in which the wafer W is to be installed. The mask M is installed on the inferior surface that is one side surface on a side facing the wafer W to be installed on this mask holder 3b in the configuration. In this mask holder 3b, a mask suction fixing mechanism 3ba is disposed as mask suctioning means for positioning and fixing the mask M to be installed in the center of the inferior surface of this mask holder 3b on the inferior surface of this mask holder 3b.

On the other hand, a Z-stage 3c is installed on the bottom surface portion of the framing body 3a of the exposure unit 3. This Z-stage 3c is an XYθ stage with a three-dimensional adjustment structure for adjusting each of the X direction, the Y direction, and the inclination angle (the θ direction) of the exposure stage 3f mounted on this Z-stage 3c via a load cell 3d and a level adjustment mechanism 3e. That is, this Z-stage 3c is configured to move the exposure stage 3f in the horizontal direction (the X direction), move up and down this exposure stage 3f in the vertical direction (the Y direction), and further adjust the inclination angle (the θ direction) of this exposure stage 3f.

Here, this exposure stage 3f is a sample table mounted in a state where the top surface of this exposure stage 3f faces the inferior surface of the mask holder 3b. Furthermore, this exposure stage 3f includes a sample suction fixing mechanism 3fa as wafer suctioning means for suctioning and fixing the wafer W to be installed in the center of the top surface of this exposure stage 3f on the top surface of this exposure stage 3f so as to position and fix the wafer W.

As illustrated in FIG. 5, the level adjustment mechanism 3e includes a spherical-surface sliding portion Sea and a holding portion 3eb. The spherical-surface sliding portion 3ea has the bottom surface side formed in a spherical surface shape. The holding portion 3eb includes a concave portion in a concave arc surface shape for supporting the sliding surface in this spherical surface shape of the spherical-surface sliding portion 3ea. Furthermore, this level adjustment mechanism 3e employs an air-cushion method in which the gas of nitrogen or similar gas is supplied between the spherical-surface sliding portion 3ea and the holding portion 3eb. Additionally, the level adjustment mechanism 3e is a spherical-surface sliding mechanism that can slide the spherical-surface sliding portion 3ea with respect to the concave portion in the arc surface shape of this holding portion 3eb so as to adjust the angle, that is, the inclination (the θ direction) of the exposure stage 3f mounted on this spherical-surface sliding portion 3ea.

The load cell 3d is a pressure sensor that detects a force when the Z-stage 3c moves up and down the exposure stage 3f to bring the wafer W installed on this exposure stage 3f into contact with the mask M installed on the inferior surface of the mask holder 3b for positioning, so as to detect the applied pressure such as the contact pressure of the wafer W with respect to this mask M.

Furthermore, in the exposure unit 3, as illustrated in FIG. 8b, a three-point ball contact mechanism 3g is mounted. When the wafer W installed on the exposure stage 3f of this exposure unit 3 and the mask M that is suctioned and fixed to the inferior surface of the mask holder 3b are leveled and aligned, the ball contact mechanism 3g is interposed between these wafer W and mask M. This ball contact mechanism 3g includes a plurality of, for example, three balls 3ga as spherical bodies. These balls 3ga are installed in respective positions separated from one another at regular intervals on the inferior surface of the mask holder 3b along the circumferential direction, and are fixed and mounted on the distal end portions of respective elongated ballbars 3gb. On the respective base end sides of these ballbars 3gb, drive mechanisms 3gc are mounted for turning these ballbars 3gb in the horizontal direction so as to sandwich the respective balls 3ga interposed between the mask M and the wafer W at regular intervals on the outer peripheral edge.

On the other hand, the conveyance container 4 is a minimal shuttle as a sealed container for conveying the object that causes some troubles such as contamination and reaction by being directly exposed to the external air, that is, the wafer W and the mask M. Specifically, this conveyance container 4 has the structure that blocks both of fine particles and gas molecules flowing to the inside, and has the yellow room structure that blocks the entrance of the UV light. As illustrated in FIG. 6, this conveyance container 4 includes a hollow disk-shaped conveyance-container main body 4a that has an opened inferior surface. To the inferior surface of this conveyance-container main body 4a, a container door 4b is removably mounted. The top surface of this container door 4b has a shape on which the wafer W and the mask M can be installed. In the state where the wafer W or the mask M is installed on the top surface of the container door 4b, fitting this container door 4b to the inferior surface of the conveyance-container main body 4a causes a state where the inside of this conveyance container 4 is sealed in this configuration.

Furthermore, the docking port 2d of the front chamber 2c is an installation port for installing the conveyance container 4 that houses the wafer W or the mask M, and includes an apparatus door 2da fitted from the inside of this front chamber 2c as illustrated in FIG. 7. In a state where the container door 4b faces downward, the conveyance container 4 is fitted to this apparatus door 2da. In this state, the apparatus door 2da is moved downward so as to move the container door 4b downward together with the apparatus door 2da due to, for example, the operation of the electromagnet or similar operation. The wafer W, the mask M, or similar object installed on this container door 4b can be conveyed to the inside of the front chamber 2c in this configuration.

Furthermore, on the upper portion of the framing body 3a of the exposure unit 3, a workpiece detecting camera 6, a monitoring camera 7, and a UV irradiation unit 8 are mounted while being arranged in a row as illustrated in FIG. 1, FIG. 3, and FIG. 4. These workpiece detecting camera 6, monitoring camera 7, and UV irradiation unit 8 are arranged in a row along the conveying direction while the conveying device 5 conveys the wafer W and the mask M, and are installed on a camera moving stage 9 that can move along this conveying direction. On this camera moving stage 9, a drive mechanism (not illustrated) is mounted.

Here, the workpiece detecting camera 6 detects the wafer W or the mask M conveyed to the exposure stage 3f or the mask holder 3b, for example, is constituted by a CCD camera and similar member. This workpiece detecting camera 6 is an orientation-flat detecting camera for detecting, for example, a positioning portion such as an orientation flat preliminarily formed on the mask M.

The monitoring camera 7 is a camera for alignment, and is used for adjusting the position of the mask M with respect to the wafer W based on the alignment mark of the mask M and the alignment mark of the wafer W.

Furthermore, the UV irradiation unit 8 is a UV light source output unit that is mounted in the position facing the exposure stage 3f via the mask holder 3b for proximity exposure of the wafer W installed on this exposure stage 3f through the mask M installed on the mask holder 3b. Specifically, as illustrated in FIG. 9, this UV irradiation unit 8 includes a condenser lens column 8a as a cylindrically-shaped light main body and a cylindrically-shaped integrator lens column 8b mounted to be concentrically fitted to the distal end portion of this condenser lens column 8a. On the base end side of the inside of the condenser lens column 8a, one UV-LED chip is mounted as an exposure light source so as to dispose an LED light source 8c. This LED light source 8c is constituted by a light-emitting diode that emits ultraviolet light with a short wavelength of, for example, 365 nm corresponding to i-ray.

On the optical axis on the distal end side of the LED light source 8c in the condenser lens column 8a, a plurality, for example, four of first to fourth condenser lenses 8d, 8e, 8f, and 8g are mounted for condensing the ultraviolet light irradiated from this LED light source 8c. These first to fourth condenser lenses 8d to 8g are each constituted as a convex lens as illustrated in FIG. 9. Furthermore, these first to fourth condenser lenses 8d to 8g are arranged in a straight line to have respective planar portions facing the LED light source 8c side and respective convex portions facing the distal end side of the condenser lens column 8a, and are housed in this condenser lens column 8a. These first to fourth condenser lenses 8d to 8g reduce the diffusion of the ultraviolet light from the LED light source 8c at the first condenser lens 8d, the second condenser lens 8e, the third condenser lens 8f, and the fourth condenser lens 8g in stages, thus efficiently condensing the ultraviolet light irradiated from this LED light source 8c.

Furthermore, within the integrator lens column 8b, an integrator lens 8h is housed. This integrator lens 8h is constituted by a plurality, for example, four rod lenses 8i each in a quadrangular prism shape formed with a cross-sectional square shape. Furthermore, this integrator lens 8h is constituted such that respective side surfaces of these rod lenses 8i are brought into surface contact with one another to be squarely arranged in front view and coupled together in a state where the respective longitudinal directions of the four rod lenses 8i are parallel to one another. This integrator lens 8h is installed in the position where the ultraviolet light after passing through the fourth condenser lens 8g enters into the respective rod lenses 8i. That is, this integrator lens 8h totally reflects the ultraviolet light emitted from the LED light source 8c and condensed by the first to fourth condenser lenses 8d to 8g using the respective rod lenses 8i of this integrator lens 8h, so as to uniform the irradiance distribution of the ultraviolet-light irradiation plane on which the ultraviolet lights passing through these rod lenses 8i are irradiated. Specifically, this integrator lens 8h ensures an irradiation range within ±5% on the surface of the wafer W.

Next, the following describes a semiconductor manufacturing system that includes the exposure apparatus of one embodiment described above.

Figure 10:
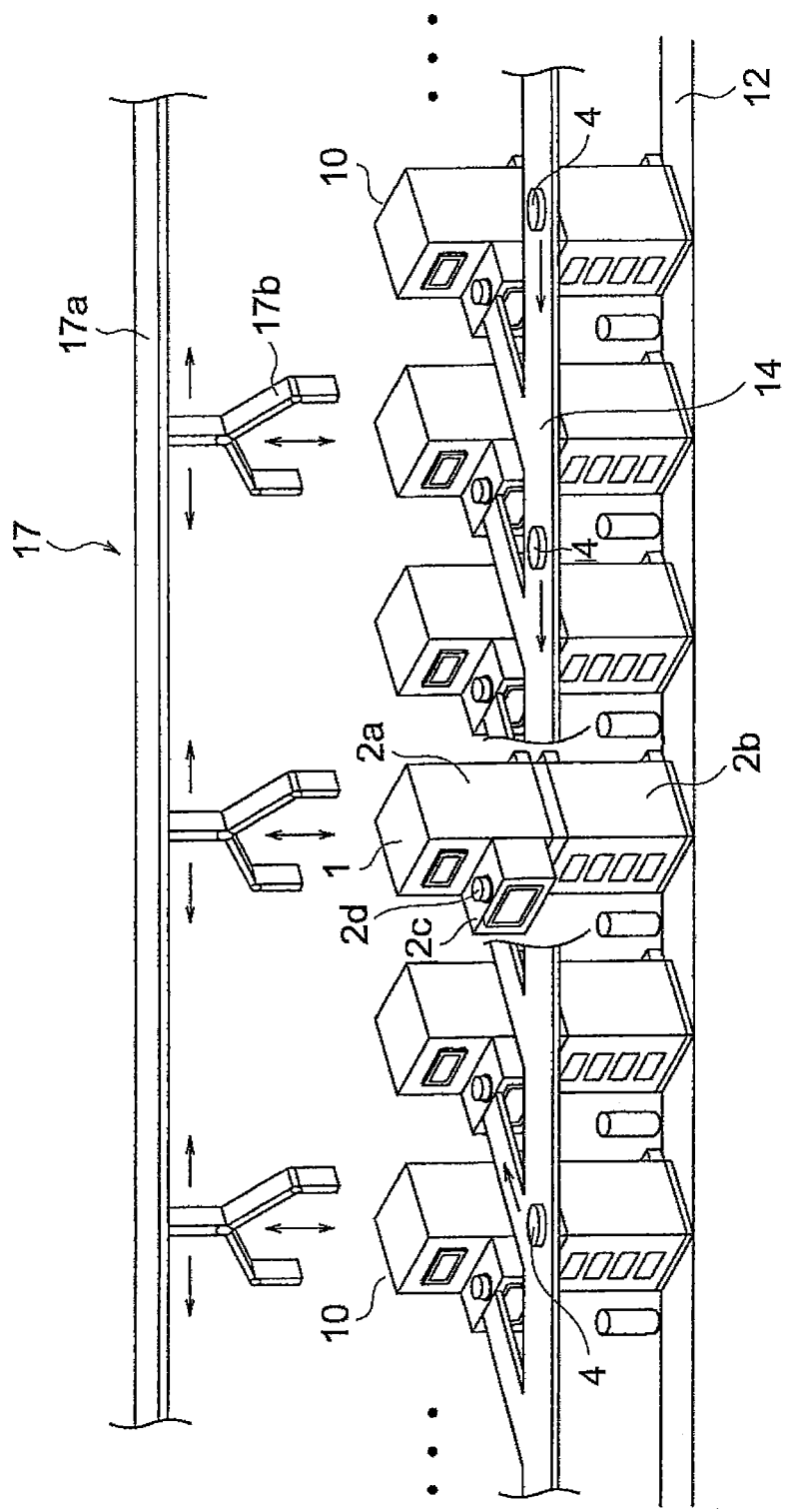
FIG. 10 is a schematic cross-sectional explanatory view illustrating a semiconductor manufacturing system that includes the above-describe exposure apparatus.

FIG. 10 is a schematic explanatory view illustrating the semiconductor manufacturing system that includes the exposure apparatus. As illustrated in FIG. 10, each unit process apparatus 10 constituted by the same chassis 2 that includes the mask aligner 1 is placed on a guideway 12 formed in a rail shape to form a semiconductor manufacturing line, thus being positioned on the same semiconductor manufacturing line preliminarily set on the floor. In an ordinary state, the respective unit process apparatuses 10 are arranged on the guideway 12 in a flow-shop system in accordance with the order of a recipe. In the arrangement example of the unit process apparatuses 10 in FIG. 10, the unit process apparatuses 10 are regularly disposed at a predetermined interval. However, the respective unit process apparatuses 10 may be closely arranged without gap.

For each unit process apparatus 10, a recipe ID is recorded on the outer surface of the unit process apparatus 10. The recipe ID is used for identifying which single process (a process corresponding to the recipe) in the process treatment this unit process apparatus 10 performs. In the record of this recipe ID, a radio frequency ID (RFID) is used to facilitate contactlessly writing and reading in association with a change of the recipe for the unit process apparatus 10 or similar parameter.

In parallel to the guideway 12, conveyance means 14 is disposed as a conveyance system between apparatuses for conveying conveyance containers 4 that house masks and wafers. This conveyance means 14 can employ a mechanism ordinarily used for a semiconductor manufacturing apparatus of a belt type, a mechanical type, or similar type. Additionally, this conveyance means 14 is configured to convey the conveyance container 4 between respective front chambers 2c disposed in the unit process apparatuses 10.

Furthermore, above the semiconductor manufacturing line thus configured, as illustrated in FIG. 10, a layout apparatus 17 is disposed for rearranging the unit process apparatuses 10. This layout apparatus 17 includes a guide rail 17a and a unit-process-apparatus transporting portion 17b. The guide rail 17a is arranged in parallel to the guideway 12. The unit-process-apparatus transporting portion 17b moves while being suspended from this guide rail 17a. This layout apparatus 17 includes a read mechanism for the recipe IDs of the respective unit process apparatuses 10. The layout apparatus 17 is configured to select the unit process apparatus 10 with a predetermined recipe ID corresponding to a control signal from a central control unit and cause the unit-process-apparatus transporting portion 17b to grip and transport the selected unit process apparatus 10 so as to rearrange the unit process apparatus 10 in a predetermined position.

Furthermore, the layout apparatus 17 is appropriate for quickly changing the layout of the multiple unit process apparatuses 10. On the other hand, the facility cost of the layout apparatus 17 is needed. Therefore, when there is no problem to spend much time on the layout change, or for saving the facility cost on the layout apparatus 17, the unit process apparatuses 10 may be conveyed by humans. In this conveyance by human, casters are disposed on the bottom portion of the unit process apparatus 10 for conveyance.

Next, the following describes an exposure method using the exposure apparatus of one embodiment described above.
<Mask Setting Process>

Firstly, the container door 4b is removed from the conveyance-container main body 4a of the conveyance container 4 to set the mask M on this container door 4b. Subsequently, this container door 4b is mounted to the conveyance-container main body 4a to set this mask M in the conveyance container 4.
<Mask Carry-In Process>

Next, in a state where this container door 4b side on which the mask M is set in the conveyance container 4 is directed downward, this conveyance container 4 is fitted to the docking port 2d of the front chamber 2c of the mask aligner 1. At this time, for example, in a manual mode or similar mode, the Z-stage 3c and the level adjustment mechanism 3e are driven as necessary to perform the leveling of the exposure stage 3f.

Thereafter, the apparatus door 2da of the docking port 2d of the front chamber 2c of the mask aligner 1 is downwardly moved to downwardly move the container door 4b of the conveyance container 4 together with this apparatus door 2da. Accordingly, the container door 4b is removed from this conveyance container 4 so as to open the conveyance container 4.

In this state, the height of the exposure stage 3f is adjusted by the Z-stage 3c to move this exposure stage 3f to a mask-delivery position set in advance. Subsequently, for example, an automatic mode or similar mode is set. With pressing a start switch (not illustrated) for starting the driving of the conveying device 5 or similar operation, the mask M installed on the container door 4b is held by the conveying device 5 and then conveyed by the expansion/contraction actuator. Then, the mask M is installed in a predetermined position on the exposure stage 3f of the exposure unit 3.

Thereafter, the mask M installed on this exposure stage 3f is vacuum-suctioned by the sample suction fixing mechanism 3fa of this exposure stage 3f to be suctioned and fixed in the predetermined position on this exposure stage 3f.

Subsequently, the exposure stage 3f is moved by the Z-stage 3c so as to achieve a height within a preliminarily registered focal length of the workpiece detecting camera 6. Then, the exposure stage 3f is set to a wait state. In this state, for example, in the manual mode or similar mode, the Z-stage 3c is driven as necessary while the mask pattern of the mask M is confirmed by visual observation using the workpiece detecting camera 6, so as to perform position adjustment of the mask M on the exposure stage 3f in the X direction, the Y direction, and the θ direction.

Subsequently, for example, in the manual mode or similar mode, this exposure stage 3f is upwardly moved by the Z-stage 3c until the mask M on the exposure stage 3f is brought into close contact with the inferior surface of the mask holder 3b. In this state, the mask M is vacuum-suctioned by the mask suction fixing mechanism 3ba of the mask holder 3b to suction and fix the mask M in a predetermined position on the inferior surface of this mask holder 3b.

Thereafter, suction fixing of the mask M by the sample suction fixing mechanism 3fa of the exposure stage 3f is released, and then this exposure stage 3f is moved to the mask-delivery position by the Z-stage 3c.

Furthermore, for example, with a simulated carry-out operation of the mask M or similar operation, a bring-back operation of the conveying device 5 is performed and the apparatus door 2da of the docking port 2d is moved upward. Accordingly, the container door 4b is fitted to the conveyance-container main body 4a of the conveyance container 4 fitted to this docking port 2d so as to ensure sealing.

Subsequently, the empty conveyance container 4 that is sealed by mounting this container door 4b is removed from the docking port 2d of the front chamber 2c.

<Wafer Carry-In Process>

Next, the conveyance container 4 that houses the wafer W before the exposure treatment is prepared and fitted to the docking port 2d of the mask aligner 1 while the container door 4b side of this conveyance container 4 is directed downward.

Thereafter, the apparatus door 2da of the docking port 2d of the mask aligner 1 is downwardly moved to downwardly move the container door 4b of the conveyance container 4 together with this apparatus door 2da. Accordingly, the container door 4b is removed from this conveyance container 4 so as to open the conveyance container 4.

In this state, for example, the automatic mode or similar mode is set. With pressing the start switch of the conveying device 5 or similar operation, the wafer W installed on the container door 4b is held by the conveying device 5 and then conveyed by the expansion/contraction actuator. Then, the wafer W is installed in a predetermined position on the exposure stage 3f of the exposure unit 3. At this time, the height of the exposure stage 3f is adjusted by the Z-stage 3c to move this exposure stage 3f to a wafer-delivery position. That is, because these mask M and wafer W are different in mass, the amount of deflection in the longitudinal direction of this expansion/contraction actuator is changed correspondingto the length of a conveying stroke by the expansion/contraction actuator of the conveying device 5. Thus, the delivery positions of these mask M and wafer W are different from each other.

Furthermore, the wafer W installed on the exposure stage 3f is vacuum-suctioned by the sample suction fixing mechanism 3fa of this exposure stage 3f to be suctioned and fixed in the predetermined position on this exposure stage 3f. In this state, as illustrated in FIG. 8, the drive mechanism 3gc is driven to perform a turning operation of the respective ballbars 3gb so as to insert the respective balls 3ga of the ball contact mechanism 3g into a ball insertion position B between the mask M and the wafer W from a ball standby position A. At this time, the respective balls 3ga of this three-point ball contact mechanism 3g are set to contacting positions in contact with the surface of the photoresist applied over the wafer W.

Next, the alignment position of the monitoring camera 7 registered in advance is moved. Specifically, the exposure stage 3f is adjusted in the upward and downward directions by the Z-stage 3c to be in the focus position, that is, in a position within the focus depth of this monitoring camera 7.

Furthermore, for example, in the manual mode or similar mode, the exposure stage 3f is upwardly moved by the Z-stage 3c such that the wafer W on this exposure stage 3f approaches the mask M. At this time, the respective balls 3ga of the ball contact mechanism 3g are sandwiched between the photoresist on the wafer W and the mask M. Accordingly, the mask M and the wafer W become unstable (not in a parallel state) due to these respective balls 3ga. However, a sliding action of the holding portion 3eb on the spherical-surface sliding portion 3ea of the level adjustment mechanism 3e ensures the levelness between the wafer W on the exposure stage 3f and the mask M, thus performing leveling.

Next, in a state after three-dimensional positioning and leveling of these wafer W and mask M, for example, in the manual mode or similar mode, a clearance distance (alignment gap) of, for example, 30 μm (any set value) from the mask M is ensured. In this state, the monitoring camera 7 is used to set a state that allows observing both of the alignment mark of the mask M and the alignment mark of the wafer W at the same time.

Additionally, in this state, for example, with pressing an operation switch (not illustrated) or similar operation, the Z-stage 3c is driven as necessary while these alignment marks of the mask M and the wafer W are confirmed by visual observation, so as to perform position adjustment of the wafer W on the exposure stage 3f in the X direction, the Y direction, and the θ direction, that is, alignment (positioning).

After completion of the alignment of these mask M and wafer W, the exposure stage 3f is downwardly moved by the Z-stage 3c. Subsequently, the drive mechanism 3gc is driven for a turning operation of the respective ballbars 3gb so as to move and evacuate the respective balls 3ga of the ball contact mechanism 3g from the ball insertion position B to the ball standby position A.

Next, the applied pressure of the wafer W with respect to the mask M is adjusted while a pressure value to be detected by the load cell 3d is confirmed. The exposure stage 3f is elevated so as to bring the wafer W into close contact with the mask M until a predetermined applied pressure is obtained.

<Exposure Process>

After these mask M and wafer W are laminated in close contact with each other, for example, with operation of an operation switch (not illustrated) or similar operation, the camera moving stage 9 is moved by the drive mechanism and the UV irradiation unit 8 is moved above these mask M and wafer W.

In this state, for example, the manual mode or similar mode is set. Based on an irradiation time set in advance, the ultraviolet light is emitted from the LED light source 8c of the UV irradiation unit 8. This ultraviolet light is irradiated to the wafer W through the mask M so as to expose this wafer W.

At this time, the ultraviolet light emitted from the LED light source 8c of the UV irradiation unit 8 is condensed after passing through the first to fourth condenser lenses 8d to 8g in the condenser lens column 8a. Subsequently, the ultraviolet light passes through the integrator lens 8h in the integrator lens column 8b so as to uniform the irradiance distribution on an ultraviolet-light irradiation plane of this ultraviolet light. Thereafter, the ultraviolet light is irradiated to the wafer W through the mask M.

<Wafer Carry-Out Process>

Thereafter, the exposure stage 3f is moved to the wafer-delivery position by the Z-stage 3c. At this time, the position of the exposure stage 3f is finely adjusted by the alignment adjustment of the mask M and the wafer W. Accordingly, this exposure stage 3f needs to be moved to the wafer-delivery position before this alignment adjustment.

Next, for example, an exposure termination signal is transmitted to perform a bring-back operation of the exposed wafer W on the exposure stage 3f by the conveying device 5 so as to install the wafer W on the container door 4b. Subsequently, the apparatus door 2da of the docking port 2d is moved upward to fit the container door 4b to the conveyance-container main body 4a of the conveyance container 4 fitted to this docking port 2d for sealing.

Subsequently, the conveyance container 4 that is sealed by mounting this container door 4b and houses the exposed wafer W is removed from the docking port 2d of the front chamber 2c.

<Mask Carry-Out Process>

Thereafter, the empty conveyance container 4 is prepared. The container door 4b side of this conveyance container 4 is directed downward to be fitted to the docking port 2d of the mask aligner 1. In this state, the apparatus door 2da of this docking port 2d is downwardly moved to downwardly move the container door 4b of the conveyance container 4 together with this apparatus door 2da. Accordingly, the container door 4b is removed from this conveyance container 4 so as to open the conveyance container 4.

Next, for example, a mask ejection mode is set by pressing a mask ejection switch (not illustrated) or similar operation. Subsequently, the exposure stage 3f is upwardly moved by the Z-stage 3c to bring the exposure stage 3f into close contact with the mask M suctioned and fixed to the inferior surface of the mask holder 3b. In this state, suction fixing of the mask M by the mask suction fixing mechanism 3ba of the mask holder 3b is released.

Thereafter, the sample suction fixing mechanism 3fa of the exposure stage 3f is driven to suction and fix the mask M onto this exposure stage 3f, this exposure stage 3f is moved to the mask-delivery position by the Z-stage 3c. In this state, suction fixing of the mask M by the sample suction fixing mechanism 3fa of the exposure stage 3f is released. Subsequently, a bring-back operation of the mask M on this exposure stage 3f is performed by the conveying device 5 so as to install the mask M on the container door 4b.

Subsequently, the apparatus door 2da of the docking port 2d is moved upward to fit the container door 4b to the conveyance-container main body 4a of the conveyance container 4 fitted to this docking port 2d for sealing. Furthermore, the conveyance container 4 in which this container door 4b is mounted and the mask M is housed is removed from the docking port 2d of the front chamber 2c to carry out the mask M from the mask aligner 1.

<Operation and Effect>

As described above, in the mask aligner 1 of the one embodiment above, the mask M and the wafer W have the same size. The same conveyance container 4 is used for these mask M and wafer W. The same doorway to the inside of the mask aligner 1 is used for the mask M and the wafer W. The front chamber 2c is also one for these. Also, the same conveying device 5 is used for conveying the mask M and the wafer W between the wafer process chamber 2e and the front chamber 2c. Accordingly, the machine mechanisms regarding these members can be about half of the machine mechanisms compared with the case where respective members for the mask M and the wafer W are disposed independently from one another. This allows significantly reducing the apparatus manufacturing cost, the apparatus control cost, and the in-plant apparatus conveyance cost and ensures simple mechanisms in the apparatus. Accordingly, the sources of generation of the fine particles can also be reduced to half amount. This allows improving the manufacturing yield. Furthermore, one conveyance control system and one plant conveyance system are enough in the mask aligner 1. This ensures a simple system and a faster response, and reduces the occurrence of bugs.

Furthermore, the conventional mask aligner does not ordinarily employ the complicated mechanisms such as the conveyance of the mask in the sealed vessel between the apparatuses and docking of the mask conveyance container with the mask aligner. Instead, a clean room is used for setting or taking out the mask to/from the mask aligner by human hand. Accordingly, preparing two systems for the mask and the wafer in the mask aligner like the conventional mask aligner results in a high-level and complicated machine mechanism, thus increasing the cost. In contrast, the mask aligner 1 of the present invention has one unified system for conveyance of the wafer W and the mask M. In this respect, the clean room is not needed. As the conveyance of these wafer W and mask M, the sealed conveyance container 4 is used for the sealed conveyance of the wafer W and the mask M between the mask aligner 1 and the conveyance container 4 using the sealed docking system of the front chamber 2c illustrated in FIG. 6 and FIG. 7. This allows completely eliminating the need for the clean room.

Additionally, the mask M and the wafer W have the same size, and these mask M and wafer W can be conveyed by one conveyance system (conveying device 5). This allows manufacturing the mask M using a wafer processing/manufacturing system itself. That is, conventionally, the mask and the wafer have different sizes. Naturally, a fine processing equipment for the mask and a wafer processing equipment are different from each other. Accordingly, these mask and wafer are manufactured in different plants. Generally, the mask is manufactured by processes of (cleaning), (mask material deposition such as chrome), (resist coating), (exposure), (developing), (etching), and (resist removal) in this order. These processes are basically a part of microfabrication processes on the wafer. The mask aligner 1 of the present invention can convey the mask M and the wafer W in the same manner. This allows manufacturing both of these mask M and wafer W in one production line. As a result, this eliminates the need for outsourcing of the mask M or similar need. This allows manufacturing the mask M on site in a short time as necessary, thus significantly reducing the manufacturing cost of the mask M.

Specifically, the configuration employs the conveying device 5 that conveys the wafer W to the exposure stage 3*f* to convey the mask M for exposing this wafer W. As a result, these wafer W and mask M can be changed every exposure. Additionally, this can facilitate replacing and selecting the mask M corresponding to the wafer W to be exposed. At this time, the wafer W is exposed through this mask M in a state where the mask M is laminated on the wafer W to be conveyed by the conveying device 5. This configuration allows setting the same size of this mask M as the size of the wafer W and downsizing this mask M.

In this case, forming each of these wafer W and mask M in a disk shape with a diameter of 12.5 mm allows exposing the wafer W as a semiconductor while changing the mask M one by one compared with a manufacturing line using a comparatively large substrate like a job-shop system and a flow-shop system that are conventionally used. This configuration allows appropriately managing very small-quantity production and multiproduct production, and is appropriate for manufacture of semiconductor in very small quantities. This allows manufacturing semiconductor in very small quantities with high cost performance.

Installing the mask holder 3*b* facing the exposure stage 3*f* from above causes the wafer W installed on the docking port 2*d* of the front chamber 2*c* of the mask aligner 1 to be taken out from the conveyance container 4 and conveyed to between the exposure stage 3*f* and the mask holder 3*b* by the conveying device 5 so as to be installed on the exposure stage 3*f*. Furthermore, the mask M installed on the docking port 2*d* is taken out from the conveyance container 4 and conveyed to between the exposure stage 3*f* and the mask holder 3*b* by the conveying device 5 so as to be suctioned and fixed to the inferior surface of the mask holder 3*b*. Accordingly, approximately the same and shorter length can be set for conveyance paths of the conveying device 5 when these wafer W and mask M are conveyed. This allows more appropriately conveying the mask M and the wafer W in a shorter period, and allows performing exposure treatment using these mask M and wafer W in a shorter period.

At this time, the sample suction fixing mechanism 3*fa* is disposed in the exposure stage 3*f*. Accordingly, in a state, where the mask M and the wafer W to be installed on this exposure stage 3*f* is suctioned and fixed on this exposure stage 3*f*, installation positions of these mask M and wafer W can be adjusted by the Z-stage 3*c* or similar member. Additionally, the mask suction fixing mechanism 3*ba* is disposed in the mask holder 3*b*. Accordingly, the mask M to be brought into contact with the inferior surface of this mask holder 3*b* can be suctioned and fixed to the inferior surface of this mask holder 3*b* for positioning. Thus, this allows simply and reliably positioning these mask M and wafer W with a comparatively simple configuration.

The mask aligner 1 includes the exposure unit 3 housed in the chassis 2. For example, a predetermined portion such as the chassis 2 and the peripheral area of the exposure unit 3 in this mask aligner 1 is covered with a member that shields an optical wavelength that causes the resist on the wafer W to be exposed, for example, an ultraviolet light. This member is, for example, an acrylic board colored in yellow. Accordingly, this mask aligner 1 itself can be used as an ultraviolet ray-shielded room what is called a yellow room. Furthermore, in the configuration, the wafer W and the mask M before being carried in the mask aligner 1 are housed in the conveyance container 4. Accordingly, forming this conveyance container 4 by an ultraviolet-ray shielding member to be a sealed type so as to use the inside of this conveyance container 4 as a yellow room prevents the irradiation of the ultraviolet ray to the wafer W both before being carried in the mask aligner 1 and after being carried out. This allows eliminating the need for housing these conveyance container 4 and mask aligner 1 in the ultraviolet ray-shielded room (yellow room).

Furthermore, the mask aligner 1 itself is small-sized. Even in the case where this mask aligner 1 or the conveyance container 4 itself is not used as a yellow room, the workroom for housing these mask aligner 1 and conveyance container 4 can be downsized. Accordingly, the ultraviolet ray-shielded room (yellow room) can also be downsized compared with conventional manufacturing lines in a job-shop system and a flow-shop system.

Specifically, in a semiconductor pretreatment plant that has a conventional manufacturing line in a job-shop system or a flow-shop system, the apparatus installation area of groups of application apparatuses, exposure apparatuses, and developing apparatuses to be set in a yellow room where a light such as an ultraviolet ray is controlled occupies approximately a quarter of the overall area for a pretreatment process. However, similarly to the mask aligner 1 of the present invention, in the case where the minimal fab structure is employed for other application apparatus and developing apparatus to be housed in the same chassis 2, the region where the light such as a ultraviolet ray needs to be controlled can be reduced to approximately $\frac{1}{30}$ of the conventional configuration.

Furthermore, the mask holder 3*b* is mounted to face the exposure stage 3*f*. This allows three-dimensionally moving the exposure stage 3*f* with respect to this mask holder 3*b* by the Z-stage 3*c* and then positioning between the wafer W installed on this exposure stage 3*f* and the mask M suctioned and fixed to the inferior surface of the mask holder 3*b*. Additionally, the respective balls 3*ga* of the ball contact mechanism 3*g* are interposed between the mask M suctioned and fixed to the inferior surface of the mask holder 3*b* and the wafer W installed on the exposure stage 3*f*. In this state, the exposure stage 3*f* is upwardly moved by the Z-stage 3*c* to press the wafer W on this exposure stage 3*f* against the mask M via the respective balls 3*ga*. Accordingly, the level adjustment mechanism 3*e* causes this exposure stage 3*f* to slide along a spherical surface shape as necessary. This allows leveling of the wafer W with respect to the mask M installed on the mask holder 3*b*.

Accordingly, the leveling and the position adjustment between these mask M and wafer W can be performed without bringing these mask M and wafer W into contact with each other. This allows more simply and accurately performing positioning between these mask M and wafer W. In a state where positioning between the exposure stage 3f and the mask holder 3b is performed, irradiation of the ultraviolet light from the LED light source 8c of the UV irradiation unit 8 allows exposing the wafer W installed on the exposure stage 3f through the mask M installed on the mask holder 3b. Accordingly, the wafer W can be accurately exposed through this mask M. Specifically, the incomplete lithography area on the wafer W is formed at about 0.50 mm from the outer peripheral edge and the uniformity of the exposure amount of this wafer W becomes about ±3.3%.

Furthermore, using the light-emitting diode that causes irradiation of the ultraviolet light as the LED light source 8c of the UV irradiation unit 8 allows exposing the wafer W through the mask M using the ultraviolet light emitted from the LED light source 8c with a small heat generation amount and a short start-up time until a light with a wavelength required for the exposure is emitted. Accordingly, the exposure process of this wafer W can be performed in a shorter period and more reliably.

At this time, the ultraviolet light to be emitted from this LED light source 8c is condensed by the first to fourth condenser lenses 8d to 8g and then totally reflected by the respective rod lenses 8i of the integrator lens 8h, so as to uniformize the irradiation distribution on the ultraviolet-light irradiation plane of the ultraviolet light. This allows uniformizing the irradiation distribution of the ultraviolet ray to the surface of the wafer W to be exposed. Thus, the surface of this wafer W can be more accurately exposed over a wider range.

Furthermore, using the LED light source 8c that emits an ultraviolet light of a short-wave light with a wave length of, for example, 365 nm allows reliably and accurately exposing the wafer W with the ultraviolet light to be emitted from this LED light source 8c. Additionally, condensing the light by the first to fourth condenser lenses 8d to 8g and uniformizing the ultraviolet-ray irradiation distribution by the integrator lens 8h ensure the irradiation range within ±5% to the wafer W regarding the ultraviolet light to be emitted from the LED light source 8c. This allows exposing a range within ±5% of this wafer W. Accordingly, even in the case where the mask M with a size equal to the size of this wafer W is used, the exposure accuracy of this wafer W can be ensured.

<Others>

Here, in the above-described one embodiment, the wafer W to be exposed by the exposure unit 3 of the mask aligner 1 and the mask M each have a disk shape with a diameter of 12.5 mm in the same size. However, the present invention is not limited to this. For example, the size of the mask M can be slightly larger than the size of the wafer W. Alternatively, the respective sizes of these mask M and wafer W can be larger or smaller corresponding to the size of semiconductor to be manufactured or similar parameter.

After the balls 3ga of the ball contact mechanism 3g are interposed between the mask M suctioned and fixed by the mask holder 3b and the wafer W installed on the exposure stage 3f, the leveling and the alignment between these mask M and wafer W are performed in this configuration. However, as necessary, the configuration may perform the leveling and the alignment between these mask M and wafer W without interposing the respective balls 3ga of the ball contact mechanism 3g.

Furthermore, the integrator lens 8h of the UV irradiation unit 8 has the configuration in which the four rod lenses 8i with the cross-sectional square shapes are combined together to be squarely arranged. For example, the integrator lens 8h may have a configuration in which a plurality of rod lenses with cross sections in regular hexagon shapes are combined together in a honeycomb shape.

In the configuration, the manual mode and the automatic mode are combined in various processing operations of the mask aligner 1. As necessary, as a possible configuration, the mode can be switched to the manual mode as necessary or a fully-automatic mode can be set. In this case, after the mask M is conveyed to the mask aligner 1, the bring-back operation of the conveying device 5 is performed by a simulated carry-out operation of the mask M or similar operation. The bring-back operation of this conveying device 5 can be manually performed by generating a simulated signal of exposure completion or can be automatically performed by programming in advance or similar method.

REFERENCE SIGNS LIST 1 mask aligner
2 chassis
2a apparatus upper portion
2b apparatus lower portion
2c front chamber
2d docking port
2da apparatus door
2e wafer process chamber
3 exposure unit
3a framing body
3b mask holder
3ba mask suction fixing mechanism
3c Z-stage
3d load cell
3e level adjustment mechanism
3ea spherical-surface sliding portion
3eb holding portion
3f exposure stage
3fa sample suction fixing mechanism
4 conveyance container
4a conveyance-container main body
4b container door
5 conveying device
6 workpiece detecting camera
7 monitoring camera
8 UV irradiation unit
8a condenser lens column
8b integrator lens column
8c LED light source
8d first condenser lens
8e second condenser lens
8f third condenser lens
8g fourth condenser lens
8h integrator lens
8i rod lens
9 camera moving stage
10 unit process apparatus
12 guideway
14 conveyance means
17 layout apparatus
17a guide rail
17b unit-process-apparatus transporting portion
A ball standby position
B ball insertion position
M mask
W wafer

The invention claimed is:

1. An exposure apparatus for exposing a wafer in a predetermined size through a mask having a same size as a size of the wafer, comprising:
   a shared conveying device configured to convey the wafer and the mask;
   an exposure stage on which the wafer conveyed by the conveying device is to be installed;
   a mask holder mounted to face the exposure stage, the mask conveyed by the conveying device being to be installed on the mask holder; and
   an exposure light source mounted to face the exposure stage via the mask holder,
   wherein the conveying device is configured to convey the wafer and the mask to between the exposure stage and the mask holder.

2. The exposure apparatus according to claim 1, further comprising
   a front chamber that includes an installation port for installing the wafer and the mask to be conveyed by the conveying device,
   wherein the conveying device is configured to convey the wafer and the mask installed on the installation port of the front chamber to between the exposure stage and the mask holder.

3. A semiconductor manufacturing system, comprising the exposure apparatus according to claim 2,
   wherein the mask and the wafer have the same size, and conveyance of the mask and conveyance of the wafer are performed by one conveyance system between apparatuses.

4. An exposure method, comprising:
   a mask carry-in step of: conveying a mask by the conveying device of the exposure apparatus according to claim 2; and installing the mask on a side facing the exposure stage in the mask holder;
   a wafer carry-in step of: conveying a wafer by the conveying device; and installing the wafer on a side facing the mask holder in the exposure stage;
   an exposure process of causing irradiation of a light from the exposure light source to expose the wafer through the mask;
   a wafer carry-out process of conveying the wafer by the conveying device to carry out the wafer from the exposure stage; and
   a mask carry-out process of conveying the mask by the conveying device to carry out the mask from the mask holder.

5. A semiconductor manufacturing system, comprising the exposure apparatus according to claim 1,
   wherein the mask and the wafer have the same size, and conveyance of the mask and conveyance of the wafer are performed by one conveyance system between apparatuses.

6. An exposure method, comprising:
   a mask carry-in step of: conveying a mask by the conveying device of the exposure apparatus according to claim 1; and installing the mask on a side facing the exposure stage in the mask holder;
   a wafer carry-in step of: conveying a wafer by the conveying device; and installing the wafer on a side facing the mask holder in the exposure stage;
   an exposure process of causing irradiation of a light from the exposure light source to expose the wafer through the mask;
   a wafer carry-out process of conveying the wafer by the conveying device to carry out the wafer from the exposure stage; and
   a mask carry-out process of conveying the mask by the conveying device to carry out the mask from the mask holder.

7. The exposure method according to claim 6,
   wherein the mask carry-in step includes conveying the mask installed on the installation port of the front chamber by the conveying device,
   the wafer carry-in step includes conveying the wafer installed on the installation port of the front chamber by the conveying device,
   the wafer carry-out process includes conveying the wafer from the exposure stage to the installation port of the front chamber, and
   the mask carry-out process includes conveying the mask from the mask holder to the installation port of the front chamber.

8. The exposure method according to claim 7,
   wherein the exposure process includes exposing the wafer through the mask in a state where the wafer is laminated on the mask.

9. The exposure method according to claim 6,
   wherein the exposure process includes exposing the wafer through the mask in a state where the wafer is laminated on the mask.

10. The exposure apparatus according to claim 1, wherein the mask holder including a mask suction fixing mechanism that is configured to position and fix the mask to be installed in an inferior surface of the mask holder on the inferior surface of the mask holder.

11. The exposure apparatus according to claim 1, wherein the exposure stage including a wafer suction fixing mechanism that is configured to position and fix the wafer to be installed in a top surface of the exposure stage on the top surface of the exposure stage.

* * * * *